(12) United States Patent
Lesea

(10) Patent No.: US 7,505,542 B1
(45) Date of Patent: *Mar. 17, 2009

(54) LOW JITTER DIGITAL FREQUENCY SYNTHESIZER WITH FREQUENCY MODULATION CAPABILITIES

(75) Inventor: Austin H. Lesea, Los Gatos, CA (US)

(73) Assignee: XILINX, Inc., San Jose, CA (US)

(*) Notice: Subject to any disclaimer, the term of this patent is extended or adjusted under 35 U.S.C. 154(b) by 603 days.

This patent is subject to a terminal disclaimer.

(21) Appl. No.: 11/195,544

(22) Filed: Aug. 1, 2005

(51) Int. Cl.
*H03D 3/24* (2006.01)

(52) U.S. Cl. .................. 375/374; 375/354; 455/75; 455/76; 455/83; 455/260; 327/151; 327/152; 327/153

(58) Field of Classification Search .......... 375/374, 375/354; 455/75, 76, 83, 260; 327/151, 327/152, 153
See application file for complete search history.

(56) References Cited

U.S. PATENT DOCUMENTS

| 6,603,360 | B2* | 8/2003 | Kim et al. .................. 331/1 A |
| 7,142,823 | B1* | 11/2006 | Logue et al. ............... 455/76 |
| 7,181,180 | B1* | 2/2007 | Teo et al. .................. 455/260 |
| 2002/0097825 | A1* | 7/2002 | Kawahara .................. 375/376 |
| 2003/0108143 | A1* | 6/2003 | Han et al. .................. 377/47 |
| 2004/0183601 | A1* | 9/2004 | Zhang ....................... 331/16 |

OTHER PUBLICATIONS

U.S. Appl. No. 09/684,528, filed Oct. 6, 2000, Percey et al.
U.S. Appl. No. 10/769,205, filed Jan. 29, 2004, Logue et al.
U.S. Appl. No. 10/109,130, filed Mar. 27, 2002, Crotty et al.

* cited by examiner

*Primary Examiner*—David C Payne
*Assistant Examiner*—Zewdu Kassa
(74) *Attorney, Agent, or Firm*—Thomas A. Ward

(57) ABSTRACT

A low jitter digital frequency synthesizer includes a first counter module, a second counter module, a snapshot module, an error value generation module, and a tapped delay line. The first counter module counts intervals of M cycles of an input clock to produce a first count. The second counter module count intervals of D cycles of an output clock to produce a second count, wherein an average rate of the output clock corresponds to M/D times a rate of the input clock. The snapshot module periodically takes a snapshot of the first and second counts to produce snapshots. The error value generation module generates a modulated error value based on the snapshots and a modulation value, where the modulation value is used to spread the spectrum of the output clock. The tapped delay line module produces the output clock based on the modulated error value.

20 Claims, 15 Drawing Sheets

DCM - low jitter digital frequency synthesizer 30

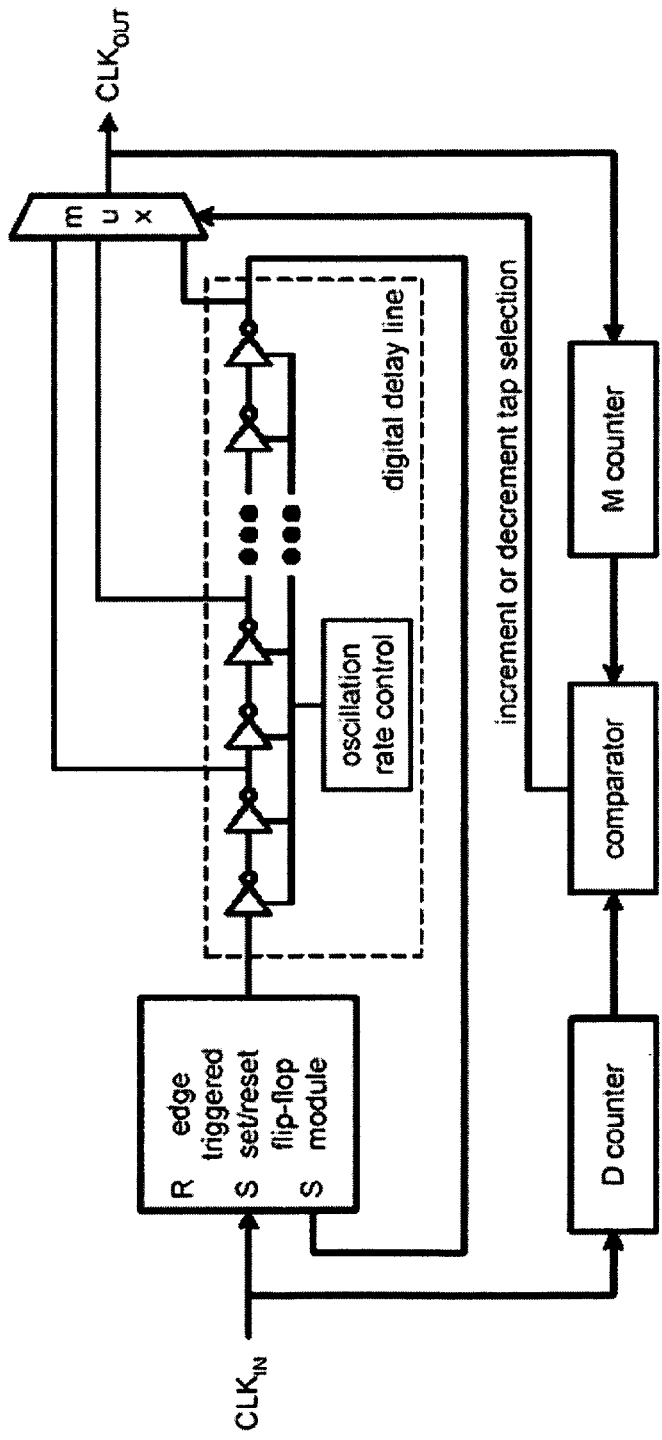
FIG. 1 - Prior Art
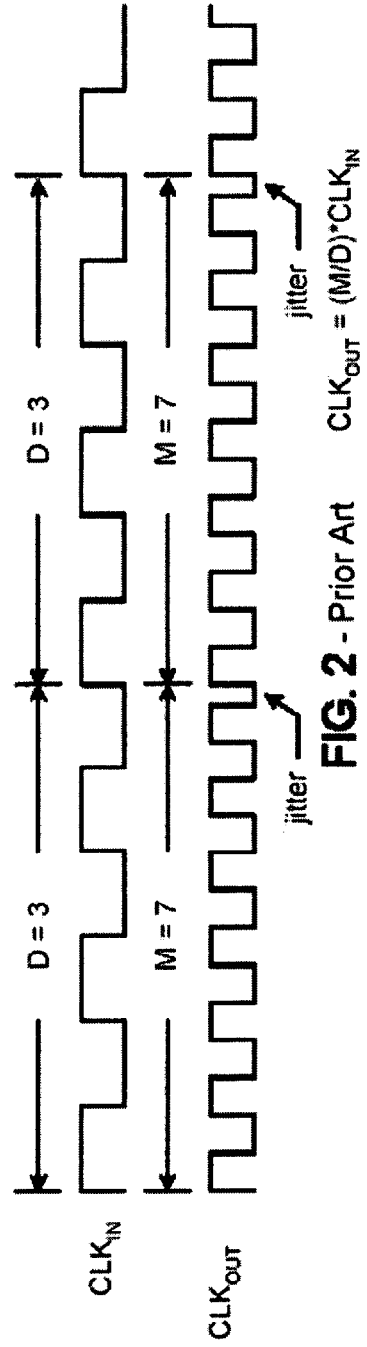
FIG. 2 - Prior Art

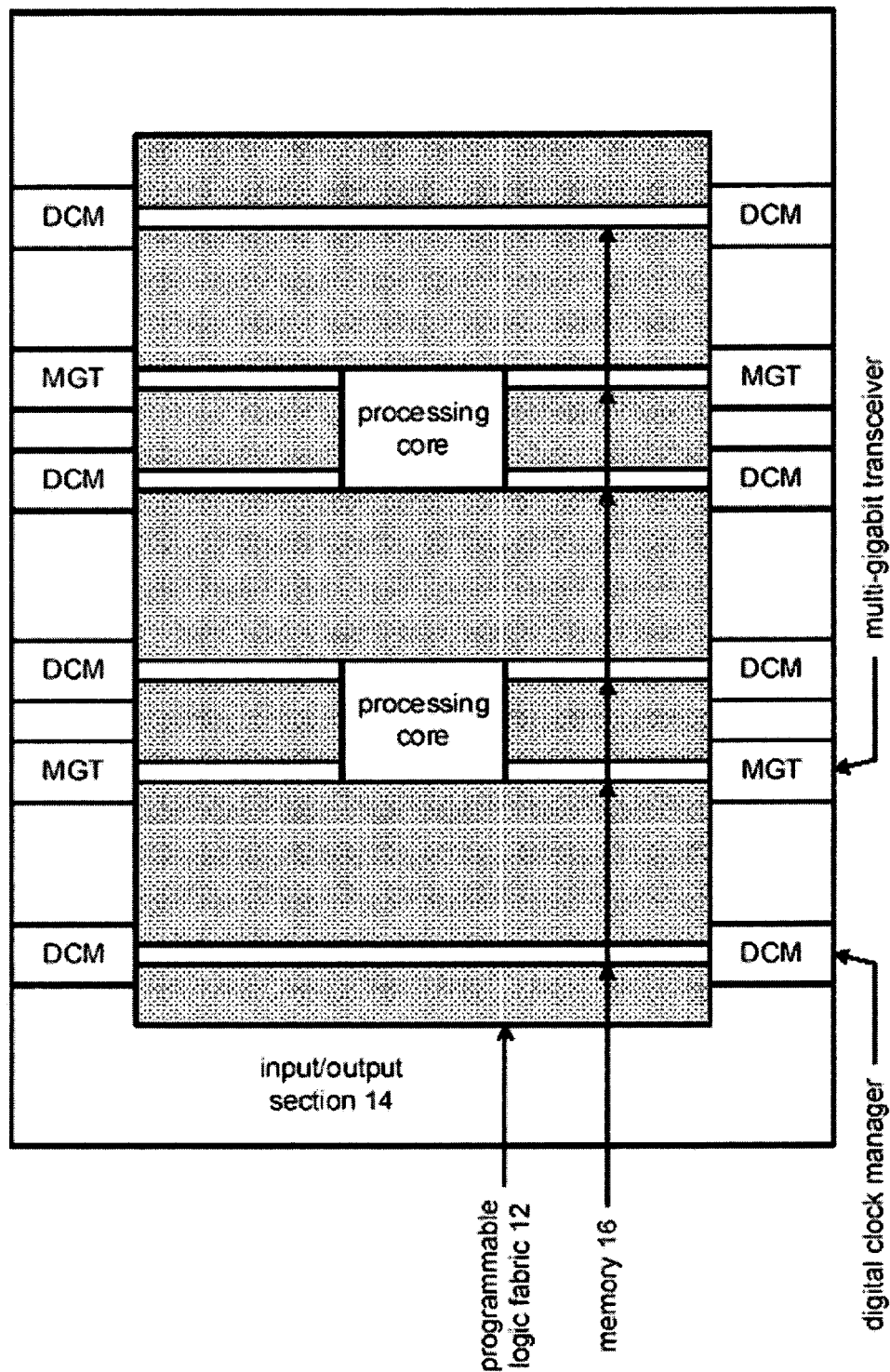

DCM - low jitter digital frequency synthesizer 30

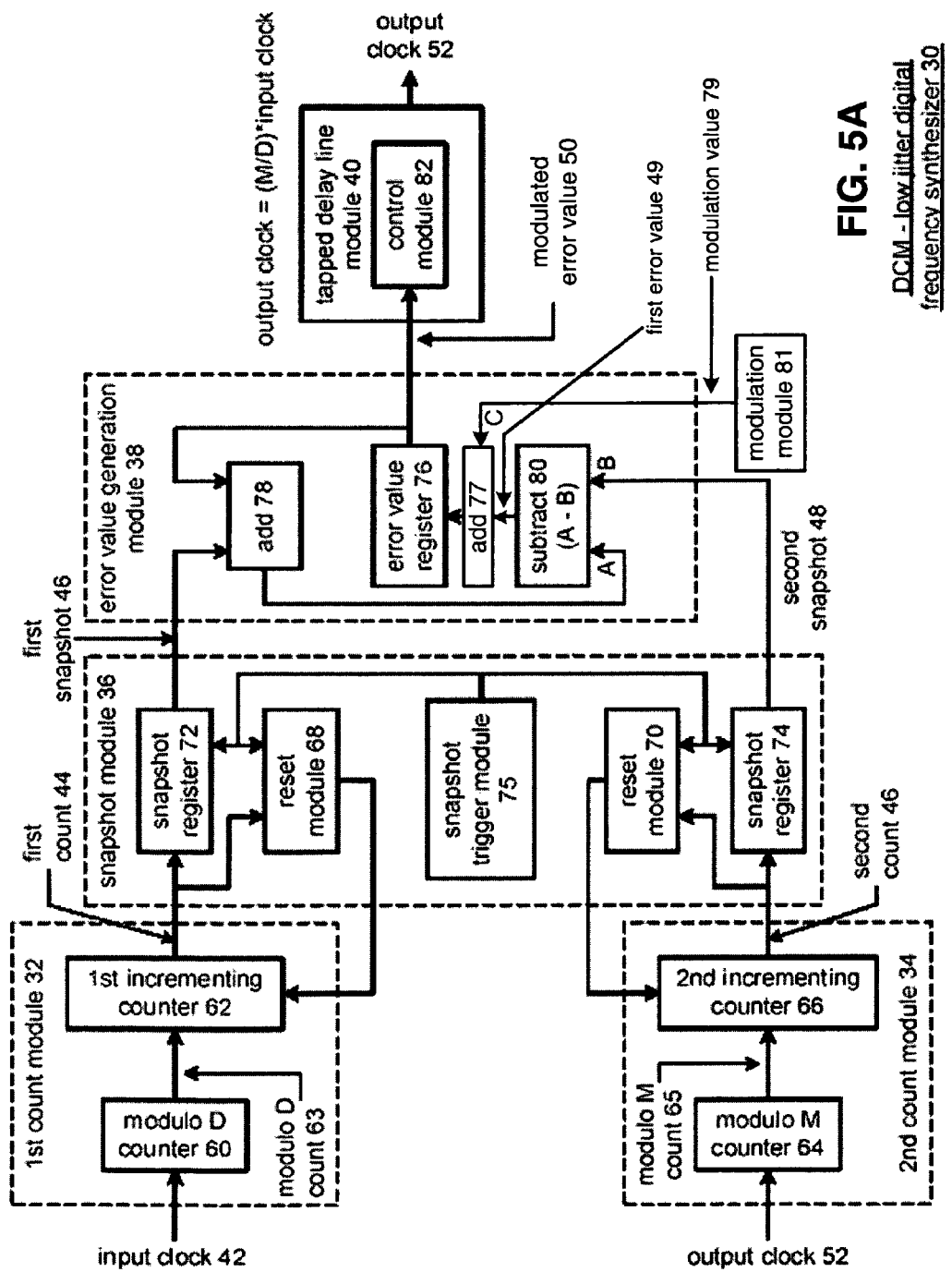

DCM - low jitter digital frequency synthesizer 30

DCM - low jitter digital frequency synthesizer 30 error value generation module 38 error value generation module 38 synchronizer overflow detect tap/trim/ tweak adjust for tapped delay line 40 tap/trim/ tweak adjust for tapped delay line 40

LOW JITTER DIGITAL FREQUENCY SYNTHESIZER WITH FREQUENCY MODULATION CAPABILITIES

BACKGROUND OF THE INVENTION

1. Technical Field of the Invention

This invention relates generally to integrated circuits and more particularly to frequency synthesizers.

2. Description of Related Art

The concept of converting one clock rate to another is well known in the art and is generally referred to as frequency synthesis. One commonly known frequency synthesizer is a phase locked loop (PLL). As is known, a typical implementation of a PLL includes a phase and frequency detector, a charge pump, a loop filter, a voltage controlled oscillator, and a feedback divider. The phase and frequency detector generates an up signal or a down signal based on a phase and/or frequency difference between a reference clock and a feedback clock that is produced by the feedback divider. The phase and frequency detector generates the up signal when the phase and/or frequency of the reference clock leads the phase and/or frequency of the feedback clock, which results when the desired output oscillation is too slow. The phase and frequency detection module generates the down signal when the phase and/or frequency of the reference clock lags the phase and/or frequency of the feedback clock, which results when the desired output oscillation is too fast.

The charge pump converts the up signal and down signal into a current. The loop filter converts the current produced by the charge pump into a control voltage. The voltage controlled oscillator produces the output oscillation (i.e., the desired output clock) based on the control voltage. The feedback divider divides the output oscillation by a divider value to produce the feedback clock. For example, if the reference oscillation is 20 MHz and the desired output oscillation is 110 MHz, the divider value is 5.5.

Such a PLL includes analog circuitry to implement one or more of its components. As is known, analog circuits are susceptible to noise generated by digital circuits. In lower rate applications, i.e., applications that do not push the processing limits of the integrated circuit manufacturing process (e.g., a few hundred MHz for 0.13 micron CMOS technology), the digital noise does not significantly affect the performance of the analog components. However, as the rate of operations increase, the digital noise becomes a more significant issue for the analog components and adversely affects their performance.

Recently, a digital frequency synthesizer has been developed for high rate applications. FIG. 1 illustrates a schematic block diagram of such a digital frequency synthesizer that includes an edge triggered set/reset flip-flop module, a digital delay line, a multiplexer, an M counter, a comparator, and a D counter. In operation, the digital delay line oscillates at a rate of (M/D) times the rate of an input clock (CLK in). For example, if the input clock is 20 MHz, M=7 and D=3, the rate of the output clock (CLK out) is 7/3 times 20 MHz, which equals 46.67 MHz. The rate of the digital delay line can be adjusted via the oscillation rate control module to ensure that the rate is near the desired rate.

To achieve phase and frequency lock between the input clock and the output clock, edge triggered set/reset flip-flop modules sets the input of the delay line at the earlier of D cycles of the input clock or M cycles of the output clock. Further, based on a phase difference between the occurrence of D cycles of the input clock and M cycles of the output clock, the comparator increments or decrements a tap selection of the digital delay line to reduce the phase error between the two clock cycle counts.

While the digital frequency synthesizer of FIG. 1 is a fully digital implementation, thus eliminating the issues with analog frequency synthesizers, a small amount of jitter is produced. FIG. 2 illustrates the generation of such jitter. As shown, for every D cycles of the input clock (e.g., 3), the digital delay line is set causing the output clock to commence in a new cycle in step with a new cycle of the input clock. This forcing of a new cycle, if the output clock is not exactly M/D times the input clock, will cause jitter. In current high rate applications, this small amount of jitter has minimal adverse affects on the operation of the integrated circuit. However, for ultra high rate applications, (e.g., rates approaching the giga Hertz range and above), the small amount of jitter may have some adverse affects on the performance of an integrated circuit.

Therefore, a need exists for a low jitter digital frequency synthesizer and method of controlling such a synthesizer.

The output clock signal produced by a digital frequency synthesizer can cause radio frequency interference (RFI) that adversely affects other circuits on the same chip as the frequency synthesizer, other circuits on other chips of the same device within which the frequency synthesizer is located, other devices (e.g., communications devices) within close proximity to the frequency synthesizer, et cetera. As used herein RFI includes both radio frequency interference and electromagnetic interference (EMI) which is closely related and similar in nature. Troublesome interference may occur at the output clock signal frequency if the amplitude of the clock signal is great enough. Interference may also occur at frequency harmonics of the output clock signal.

Where RFI is a problem in electronic apparatuses that include a digital frequency synthesizer (e.g., such as printers), various techniques are often employed so as to reduce the RFI. One common technique is to provide shielding around the radiating portions of the circuitry. In addition to being expensive, such shielding often significantly adds to the cost, weight and space requirements of the electronic apparatus. Another technique commonly employed is to add a terminator in the form of a resistor and a capacitor to each radiating line within the electronic circuitry. However, such terminators are also very expensive in addition to consuming considerable space and adding to the weight of the apparatus.

Accordingly, a need also exists for improved ways to reduce the interference that may be caused by an output clock signal of a digital frequency synthesizer.

BRIEF SUMMARY OF THE INVENTION

The low jitter digital frequency synthesizer and control thereof of the present invention substantially meets these needs and others. In one embodiment, control of a low jitter digital frequency synthesizer begins by counting cycles of an input clock to produce an input clock count and counting cycles of an output clock to produce an output clock count. The processing continues by incrementing a first counter to produce an incremented first count when the input clock count reaches a value of D and by incrementing a second counter to produce an incremented second count when the output clock count reaches a value of M. The processing continues by periodically taking a snapshot of the incremented first count to produce a snapshot first count and periodically taking a snapshot of the incremented second count to produce a snapshot second count. The processing continues by generating a modulated error value based on the snapshot first count, the snapshot second count and a modulation value. The processing continues by adjusting a delay line tap value based on the modulated error value. With such a method and/or apparatus implementing such a method, a free running oscillator is controlled within a digital frequency synthesizer to produce a low jitter output clock signal. The modulation value is provided to spread the spectrum of the output clock signal, so that it does not cause troublesome interference.

In another embodiment, a low jitter digital frequency synthesizer includes a first counter module, a second counter module, a snapshot module, an error value generation module, and a tapped delay line. The first counter module is operably coupled to count intervals of M cycles of an input clock of the low jitter digital frequency synthesizer to produce a first count. The second counter module is operably coupled to count intervals of D cycles of an output clock of the low jitter digital frequency synthesizer to produce a second count, wherein a rate of the output clock corresponds to M/D times a rate of the input clock. The snapshot module is operably coupled to periodically take a snapshot of the first count to produce a first snapshot and of the second count to produce a second snapshot. The error value generation module is operably coupled to generate a modulated error value based on the first snapshot, the second snapshot and a modulation value. The tapped delay line module is operably coupled to produce the output clock based on the modulated error value. Such an embodiment provides a low jitter digital frequency synthesizer that utilizes a free running oscillator. Again, the modulation value is provided to spread the spectrum of the output clock signal, so that it does not cause troublesome interference. The modulation value can be periodically generated by a modulation module that is part of the digital frequency synthesizer, or external to the digital frequency synthesizer.

Further embodiments, and the features, aspects, and advantages of the present invention will become more apparent from the detailed description set forth below, the drawings and the claims.

BRIEF DESCRIPTION OF THE SEVERAL VIEWS OF THE DRAWINGS

FIG. 1 is a schematic block diagram of a digital frequency synthesizer in accordance with the prior art;

FIG. 2 is an example timing diagram of the operation of the digital frequency synthesizer of FIG. 1;

FIG. 3 is a schematic block diagram of a programmable logic device in accordance with the present invention;

FIGS. 5A, 5B and 5C are schematic block diagrams of the low jitter digital frequency synthesizer in accordance with various embodiments of the present invention;

DETAILED DESCRIPTION OF THE INVENTION

FIG. 3 is a schematic block diagram of a programmable logic device (PLD) 10 that includes programmable logic fabric 12, an input/output section 14, and memory 16. The programmable logic fabric 12 may include one or more processing cores and programmable logic circuitry. Such programmable logic circuitry may include programmable logic arrays (PLA), programmable array logic (PAL) devices, erasable programmable logic devices (EPLD) and/or programmable gate arrays (PGA). The memory 16 may be block random access memory (BRAM). The input/output section 14 may include a plurality of digital clock managers (DCM) and a plurality of multi-gigabit transceivers (MGT). Another example of a PLD is the Virtex 4 Field Programmable Gate Array (FPGA) from Xilinx, Inc., of San Jose Calif. The Virtex 4 FPGA also includes one or more DCMs.

The digital clock managers (DCM) provide various clock signals to the programmable logic fabric 12 and may further provide clock signals to the multi-gigabit transceivers. The multi-gigabit transceivers provide digital interfaces for the programmable logic fabric 12 to components external to the programmable logic device 10. In general, the multi-gigabit transceivers provide serial to parallel conversion of received serial data and provide parallel to serial conversions for outgoing data.

Figure 4:
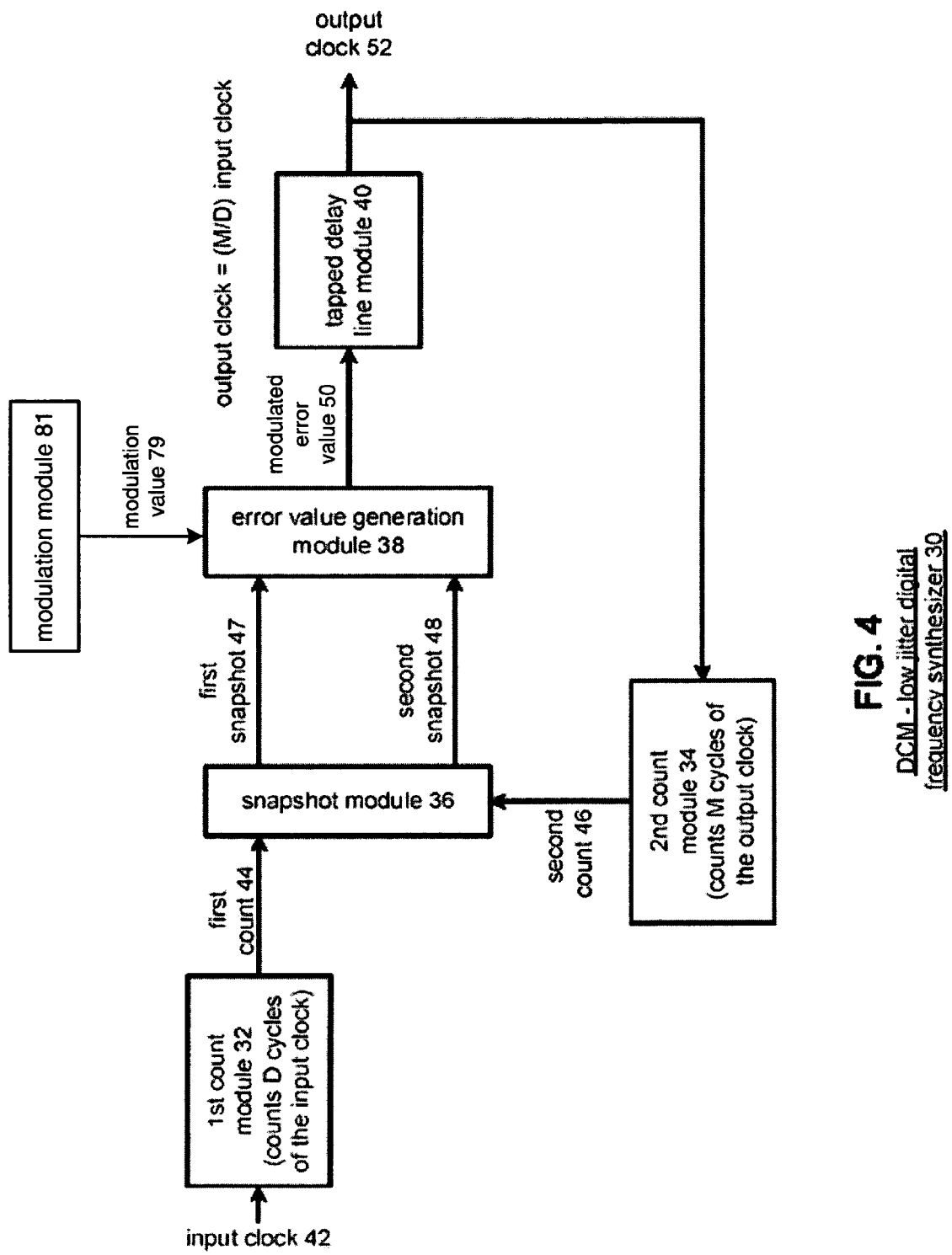
FIG. 4 is a schematic block diagram of a low jitter digital frequency synthesizer in accordance with the present invention.

FIG. 4 is a schematic block diagram of a digital clock manager (DCM) that is implemented as a low jitter digital frequency synthesizer (DFS) 30. The low jitter DFS 30 includes a $1^{st}$ count module 32, a $2^{nd}$ count module 34, a snapshot module 36, an error value generation module 38, and a tapped delay line module 40. As configured, the low jitter DFS 30 is implemented as a free-running oscillator. In particular, the input clock 42 does not control the timing of the tapped delay line module 40 directly. As such, the tapped delay line module 40 does not incur a forced cycle adjustment per the input clock signal and thus avoids the jitter associated with the forced cycle adjustment producing a low jitter output clock 52.

As mentioned above, the output clock signal 52 can cause interference that adversely affects other circuits on the same chip as the DFS 30, other circuits on other chips of the same device within which the DFS 30 is located, other devices (e.g., communications devices) within close proximity to the DFS, et cetera. To overcome this problem, a modulation value 79 is used to frequency modulate the output clock 52 such that the energy of the output clock signal 52 is spread over a range of frequencies, while the average rate of the output clock 52 equals to the desired output clock frequency.

Such a modulation value 79 can be generated by a modulation module 81, as shown in FIG. 4. The modulation module 81 can be part of the DFS 30, can be external to the DFS 30 but part of a programmable logic device within which the DFS is implemented, or can be external to the programmable logic device within which the DFS is implemented. The modulation module 81 periodically produces the modulation value 79, which is used to frequency modulate the output clock 52.

In one embodiment of the present invention, the modulation module 81 is a pseudo random sequence generator, which can be implemented, e.g., using a well known implementation of a pseudo random shift register. For example, if the pseudo random shift register is 6 bits wide, is will produce a sequence of signed pseudo random numbers having values between −31 and +31, with the average of the numbers being zero. The modulation module 81 is preferably clocked at a rate that is much slower (e.g., about 100 times slower) than the output clock 52. This allows the feedback loop to track the average output clock frequency. The output clock 52 is thereby modulated by the pseudo random modulation value to spread the spectrum of the output clock 52.

In another embodiment of the present invention, the modulation module 81 is implemented using block RAM that includes a table of numbers, the average of which is zero. For a more specific example, 4095 blocks of RAM can be used to store values that range from −31 to +31, and the blocks of RAM can be stepped through such that the modulation value output 79 of the block RAM resembles random numbers from −31 to +31.

These are just a few exemplary implementations of the modulation module 81. Other variations are also within the spirit and scope of the present invention. Additionally, the modulation value 79 produced by the modulation module 81 need not be a pseudo random number, so long as the desired spreading of the output clock frequency can be achieved. For example, the modulation module 81 can produce a modulation value 79 that over time resembles a linear sawtooth or a sinusoid. One of average skill in the art will appreciate that other modulation schemes are also within the spirit and scope of the present invention. In each embodiment, it is preferred that an average of the modulation value over any extended period of time (e.g., a few seconds) is equal to zero, so that an average frequency of the output clock 52 is equal to the desired output clock frequency.

The sequence of the modulation value 79 can be changed by changing the modulation scheme implemented by the modulation module 81, as has just been explained. The rate at which the modulation value 79 changes can be adjusted by adjusting the rate at which the modulation module 81 is clocked. Additionally, the gain of the modulation can be specified by the number of significant bits of the modulation value 79 that are used to produce the modulated error value 50. For example, if the modulation module 81 is a pseudo random shift register that is 6 bits wide, it is possible that the modulation value 79 is equal to only the most significant bit, equal to the two most significant bits . . . or equal to all of the 6 bits output by the pseudo random shift register.

In operation, the low jitter frequency synthesizer 30 produces an output clock 52 based on the input clock 42 and two values (M and D). As shown, the average rate of the output clock 52 equals (M/D)* rate of the input clock. The values for M and D may be changed to accommodate different required clock signals for the programmable logic device or for other devices that may incorporate the low jitter digital frequency synthesizer.

To maintain the relationship between the output clock 52 and the input clock 42 while still maintaining the free-running oscillation of the tapped delay line module 40, the $1^{st}$ count module 32 counts D number of cycles of the input clock to produce a $1^{st}$ count value 44. The $2^{nd}$ count module 34 counts M cycles of the output clock to produce a $2^{nd}$ count 46.

The snapshot module 36 takes a snapshot, at periodic intervals, of the $1^{st}$ count 44 to produce a $1^{st}$ snapshot 47 and of the $2^{nd}$ count 46 to produce a $2^{nd}$ snapshot 48. When the snapshot module 36 takes the snapshots of the $1^{st}$ and $2^{nd}$ count values 44 and 46, it resets the $1^{st}$ and $2^{nd}$ count modules 32 and 34, which will be described in greater detail with reference to FIG. 5.

If the output clock 52 corresponds to M/D times the input clock, the snapshot of the $1^{st}$ and $2^{nd}$ counts 47 and 48 should match. If, however, the output clock 52 does not exactly correspond to M/D times the input clock, over time the accumulation of the snapshots of the $1^{st}$ and $2^{nd}$ counts 46 and 48 will drift and thus not match.

The error value generation module 38 (which will be described in greater detail with reference to FIGS. 5A, 5B, 5C, 8, 11A and 11B) receives the $1^{st}$ and $2^{nd}$ snapshots 47 and 48 and a modulation value 79 to produce a modulated error value 50. The tapped delay line module 40 (which will be described in greater detail with reference to FIGS. 5-7) receives the modulated error value 50 and adjusts the particular tap selection to regulate the output clock 52 such that it maintains the M/D times the input clock relationship, while also spreading the spectrum of the output clock. As one of average skill in the art will appreciate, the tapped delay line module 40 is established to have a frequency that approximates the M/D times input clock rate where the modulated error value 50 acts as a tap selection control to maintain the proper phase and frequency relationship between the input clock 42 and output clock 52. As one of average skill in the art will further appreciate, the low jitter digital frequency synthesizer 30 may be implemented using a processing module and memory to implement the modules illustrated in FIG. 4 as well as the modules and processing steps illustrated in FIGS. 5-9. The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry.

FIG. 5A is an embodiment of the low jitter digital frequency synthesizer 30 that includes the $1^{st}$ count module 32, the $2^{nd}$ count module 34, the snapshot module 36, the error value generation module 38 and the tapped delay line module 40. The $1^{st}$ count module 32 includes a modulo D counter 60 and a $1^{st}$ incrementing counter 62. The $2^{nd}$ count module 34 includes a modulo M counter 64 and a $2^{nd}$ incrementing counter 66. The snapshot module 36 includes a snapshot register 72, a reset module 68, a snapshot trigger module 75, a reset module 70 and a snapshot register 74. In the embodiment of FIG. 5A, the error value generation module 38 includes an adder 78, an adder 77, an error value register 76 and a subtraction module 80. The tapped delay line module 40 includes a control module 82.

The modulo D counter 60 counts, in a modulo fashion, D cycles of the input clock 42 to produce a modulo D count 63. The incrementing counter 62 counts the wrapping of the modulo D count 63. For instance, if D is 3, every $3^{rd}$ cycle of the input clock 42, the incrementing counter 62 is incremented by 1 to produce the $1^{st}$ count 44. Similarly, the $2^{nd}$ count module 34 utilizes the modulo M counter 64 to count M cycles of the output clock 52 to produce a modulo M count 65. The $2^{nd}$ incrementing counter 66 counts wrapping of the modulo M count 65 to produce the $2^{nd}$ count 46. For example, if M is 7, every $7^{th}$ cycle of the output clock 52, the incrementing counter 66 is incremented by 1.

The snapshot trigger module 75 initiates the taking of the snapshot of the $1^{st}$ count 44 and $2^{nd}$ count 46 by providing an input to the snapshot register 72, snapshot register 74 and reset modules 68 and 70. In general, the sampling interval, or snapshot triggering produced by the snapshot trigger module 75, will occur in sync with the input clock 42 but may range from one modulo count to multiple modulo counts of the input clock signal 42.

Upon receiving the triggering signal, the snapshot register 72 stores the current $1^{st}$ count value 44 that is produced by the $1^{st}$ incrementing counter 62. In addition, the reset module 68 determines whether an increase of the $1^{st}$ count 44 is occurring while the snapshot is being taken. If so, the reset module resets the $1^{st}$ count to a value of 1. If the snapshot does not occur while the increasing of the $1^{st}$ count value is occurring, the reset module 68 resets the $1^{st}$ count to zero.

The snapshot register 74, when triggered via the snapshot triggering module 75, stores the current $2^{nd}$ count value 46. In addition, reset module 70 resets the $2^{nd}$ incrementing counter 66 to either one or zero based on whether the snapshot occurred while the $2^{nd}$ count 46 was being incremented. If the snapshot occurred while the $2^{nd}$ count was being incremented, the $2^{nd}$ incrementing counter 66 is reset to one; otherwise it is reset to zero.

Note that the snapshot module 36 takes the snapshot of the $1^{st}$ count in a $1^{st}$ time domain that corresponds to the input clock. Once a snapshot is taken of the $1^{st}$ count, the snapshot module 36 enables the taking of the snapshot of the $2^{nd}$ count. The snapshot of the $2^{nd}$ count value 46 is done in a $2^{nd}$ time domain that corresponds to the output clock. Once the snapshot of the $2^{nd}$ count value 46 has been taken, the snapshot trigger module 75 is reset such that when the next snapshot period occurs, the snapshot of the $1^{st}$ count value will be taken followed by the taking of the $2^{nd}$ count value.

The error value generation module 38 accumulates differences between the $1^{st}$ snapshot 46 and $2^{nd}$ snapshot 48 to produce a first error value 49, which is added to a modulation value 79 to produce the modulated error value 50. If the output clock maintains an exact relationship of M/D times the input clock, and the modulation value 79 is constant, then the $1^{st}$ and $2^{nd}$ snapshots 46 and 48 will match and the first error value 49 will remain zero or at a constant value. However, due to imperfections in the circuit components, and changing of the modulation value 79, the output clock 52 will not maintain an exact M/D times the input clock 42 relationship. As such, over time, the $1^{st}$ snapshot 46 and $2^{nd}$ snapshot 48 will differ in value. When the difference in value occurs, the error value generation module 38 accumulates the modulated error value 50, which adjusts the tapped delay line module 40.

In FIG. 5A the error value generation module 38 includes additions module 78 and 77, the error value register 76 and a subtraction module 80. As shown, the addition module 78 adds the current $1^{st}$ snapshot value 46 with a previously stored modulated error value 50. The summed value is provided to subtraction module 80, which subtracts the $2^{nd}$ snapshot value 48 from the output of adder 78. The resultant value is the current first error value 49. The adder 77 adds the current first error value 49 to the current modulation value 79 to produce the current modulated error value 50, which is then stored in error value register 76. As such, the new modulated error value 50 corresponds to the previous modulated error value plus the current $1^{st}$ snapshot value 46 minus the current $2^{nd}$ snapshot value 48 plus the current modulation value 79.

The modulation value 79 is preferably updated at a much slower rate (e.g., 100 times slower) than the than the updating of the 1st and 2nd snapshot values 46 and 48. If the $1^{st}$ and $2^{nd}$ snapshot values 46 and 48 are equal, and the modulation value 79 has not changed, then the modulated error value 50 remains unchanged. If the $1^{st}$ and $2^{nd}$ snapshot values 46 and 48 are different, and/or if the modulation value 79 has changed, the error value will be increased or decreased. As one of average skill in the art will appreciate, the $2^{nd}$ snapshot value 48 may be added to the previous modulated error value via adder 78 and the $1^{st}$ snapshot value 46 may be subtracted via subtraction module 80 to produce the first error value 49.

The tapped delay line module 40 includes control module 82, which interprets the modulated error value 50. The control module 82 provides a control signal to a digital delay line, which will be described in greater detail with reference to FIG. 6, to select a corresponding tap and to fine-tune the delay line such that the output clock 52 maintains the desired relationship with the input clock, and the output clock 52 has its spectrum spread, while still allowing the digital delay line to operate as a free-running oscillator. In one embodiment, the control module 82 functions to compare the new modulated error value 50 with a previous modulated error value to determine whether the sign of the modulated error value has changed with respect to the previous modulated error value. If the sign has changed, the control module determines an amount to adjust the tapped delay line based on the current modulated error value and parameters of the digital frequency synthesizer. Such parameters of the digital frequency synthesizer include the granularity of the steps that can be made within the tapped delay line module 40, response times, slew rate, et cetera.

The control module 82 also functions to compare the modulated error value 50 with a previous modulated error value to determine whether the magnitude of the modulated error value 50 has increased with respect to the previous modulated error value. If the magnitude has increased, the control module 82 determines an amount to adjust the tapped delay line based on the increase in magnitude and the parameters of the digital frequency synthesizer. Note that even if the sign changes and/or the magnitude increases, the control module 82 may not immediately adjust the tapped delay line but may wait for further indications that the change is needed.

Figure 5B:
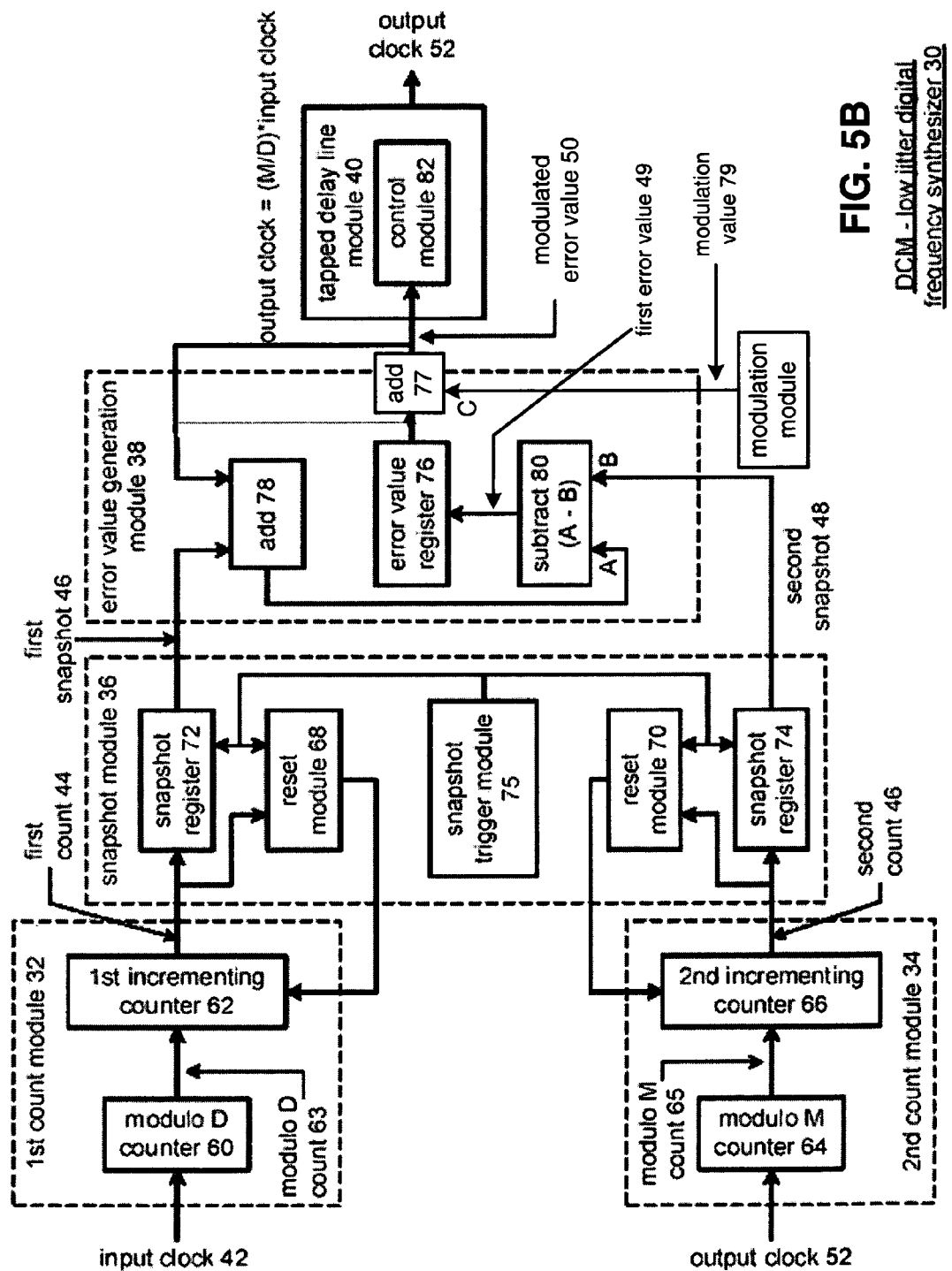

FIG. 5B is another embodiment of the low jitter digital frequency synthesizer 30. The embodiment of FIG. 5B is similar to the embodiment of FIG. 5A, but the adder 77 that adds in the modulation value 79 is located between the error value register 76 and the control module 82. In other words, in the embodiment of FIG. 5B, the adder 77 adds the contents of the error value register 76 (which is the first error value 49 in this embodiment) to the modulation value 79 to produce the modulated error value 50.

Figure 5C:
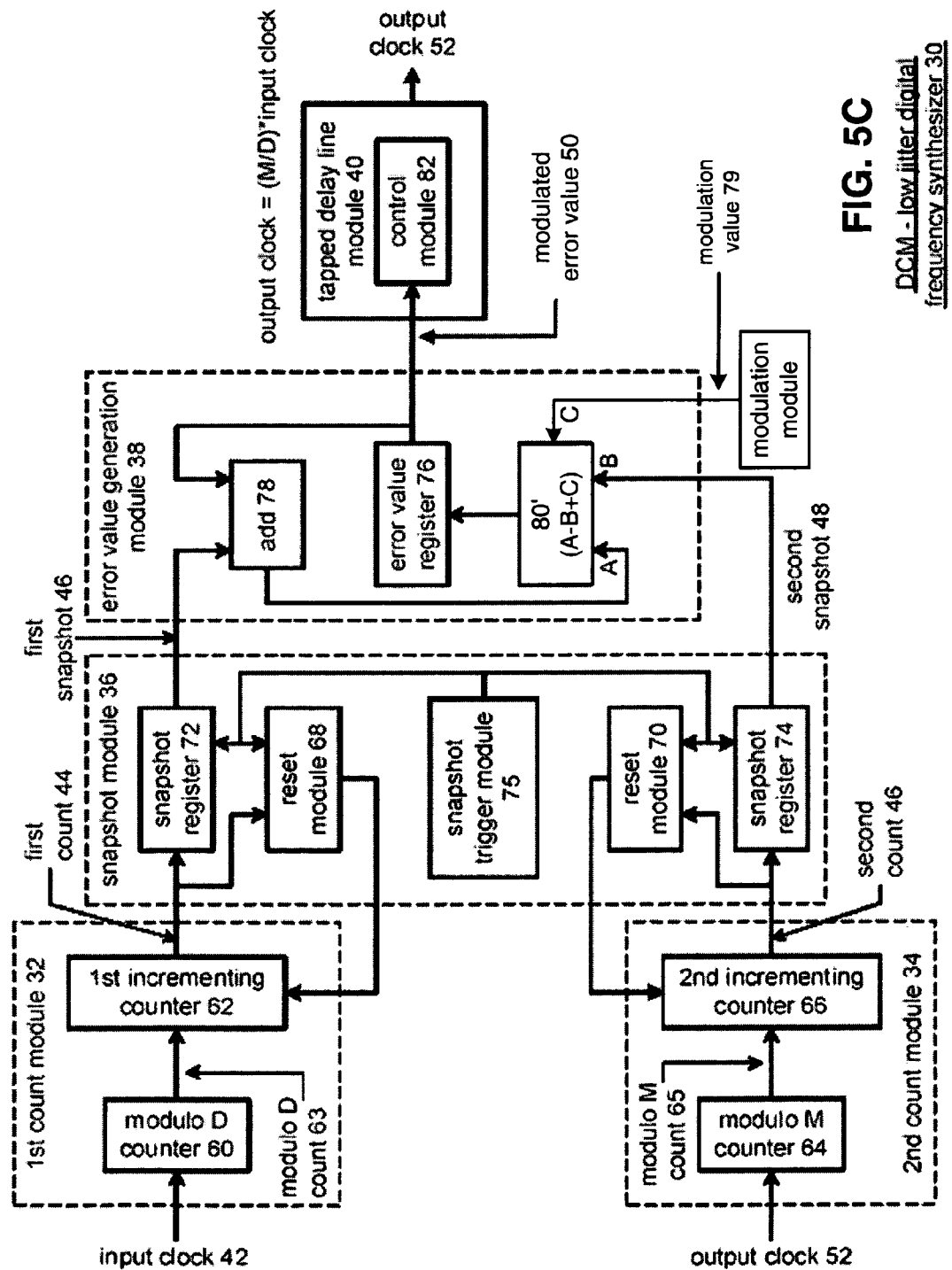

FIG. 5C is a further embodiment of the low jitter digital frequency synthesizer 30. The embodiment of FIG. 5C is similar to the embodiments of FIGS. 5A and 5B, except that the adding of the modulation value 79 is performed by module 80'. More specifically, in the embodiment of FIG. 5C, the module 80' performs both subtraction and addition, as shown.

FIGS. 5A, 5B and 5C illustrate three different ways in which the modulation value 79 can be added to produce the modulated error value 50, which is used to spread the spectrum of the output clock 52. From the description herein, one of average skill in the art will appreciate that other possibilities are also within the spirit and scope of the present invention.

Figure 6:
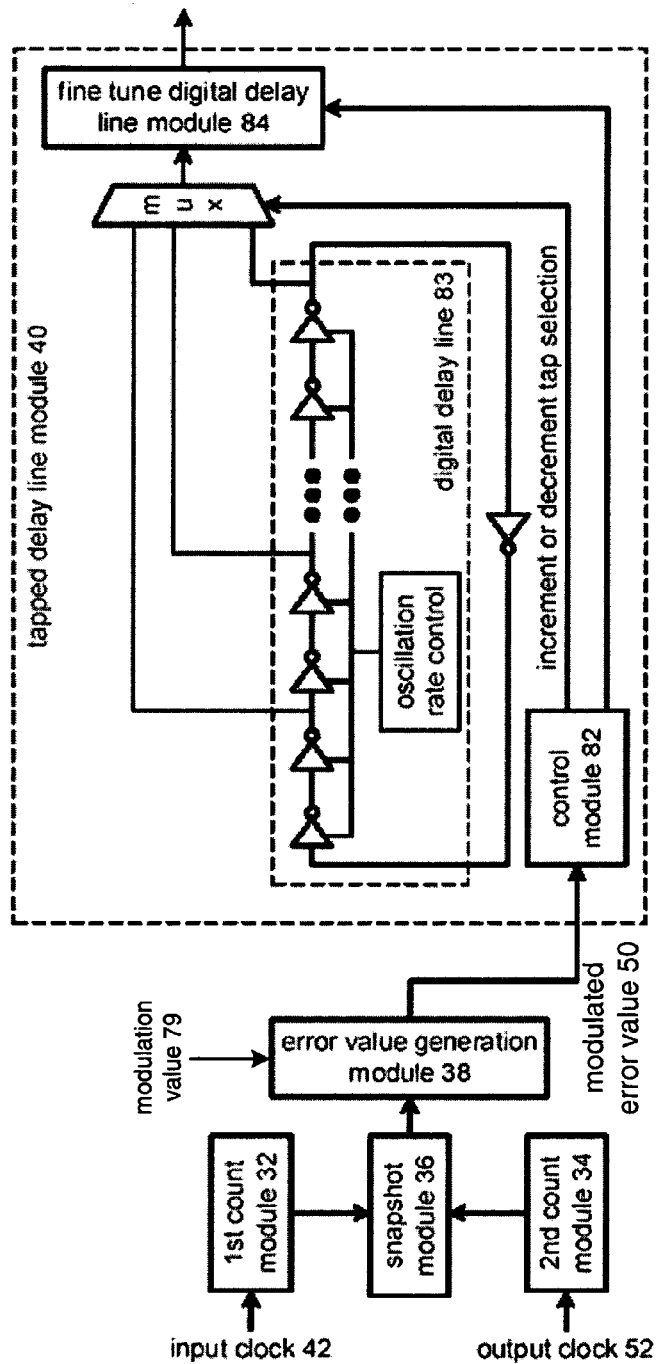
FIG. 6 is a schematic block diagram of a low jitter digital frequency synthesizer with the tapped delay line module shown in greater detail in accordance with the present invention.

FIG. 6 is a schematic block diagram of a digital frequency synthesizer that includes the $1^{st}$ count module 32, the $2^{nd}$ count module 34, the snapshot module 36, the error value generation module 38 and the tapped delay line module 40. The tapped delay line module 40 includes a digital delay line 83, the control module 82, a multiplexer (MUX) and a fine-tuned digital delay line module 84. The digital delay line 83 includes a plurality of buffers that produce slight phase shifted representations of the output clock 52. In one embodiment, the digital delay line 83 includes 128 taps. The oscillation rate control module of the digital delay line 83 regulates the rates of the corresponding buffers to adjust the overall oscillation rate of the digital delay line to maintain a rate corresponding to the desired rate of the output clock 52. The digital delay line 83 is a free-running oscillator which is achieved by feeding the output of the last buffer to the input of the $1^{st}$ buffer via an inverter.

The control module 82 receives the modulated error value 50 and produces a signal that either increments, decrements, or maintains the same tap selection, which is provided to the control input of the multiplexer. In addition, the control module 82 generates a control signal to adjust the fine-tuned digital delay line module 84 such that the output clock 52 maintains the desired relationship with the input clock.

Figure 7:
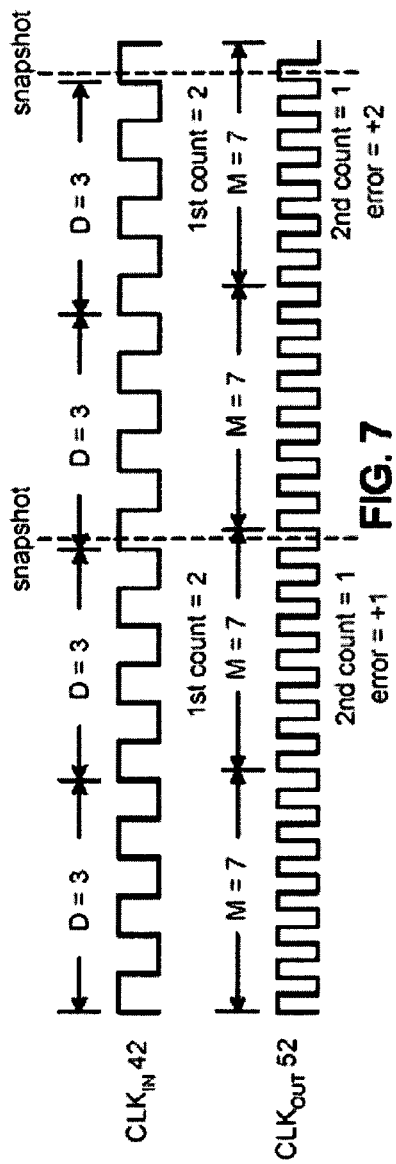
FIG. 7 is an example timing diagram of the digital frequency synthesizer of FIG. 6.

FIG. 7 is a timing diagram illustrating an example of the operation of the digital frequency synthesizer of FIG. 6. In this example, D=3 and M=7 such that the rate of the output clock 52 is 7/3rds that of the input clock 42. In this example, the periodic interval for taking snapshots occurs at approximately every two D modulo cycles of the input clock. As shown, for the input clock at the $1^{st}$ snapshot, the $1^{st}$ count equals 2 since the modulo D counter has cycled through two counts of three cycles of the input clock. The output clock 52 is shown to be slightly out of sync with the input clock 42 such that at the $1^{st}$ snapshot the $2^{nd}$ count module 34 has not cycled through two full modulo M cycles of the output clock, which, at the $1^{st}$ snapshot, yields a $2^{nd}$ count of 1. This example assumes that, at the $1^{st}$ snapshot, the modulated error value was zero such that, at the $1^{st}$ snapshot, the modulated error value is calculated to be a positive 1. At the $2^{nd}$ snapshot, the $1^{st}$ count value is again equal to 2 and the $2^{nd}$ count value remains at 1. In this instance, the difference between the $1^{st}$ and $2^{nd}$ counts is added to the previous count to increment the modulated error value to a +2 value. For instance, the new modulated error value equals the previous modulated error value (e.g., +1) plus the $1^{st}$ count (e.g., 2) minus the $2^{nd}$ count (e.g., 1) which, in this example, equals 1+2−1=2.

In this example, at the $2^{nd}$ snapshot value, the control module determines that the modulated error value has increased. At this point, it may adjust the tap selection and/or adjust the fine-tuned digital delay line module 84 to adjust the timing of the output clock 52 to better achieve the desired relationship with the input clock 42.

Figure 8:
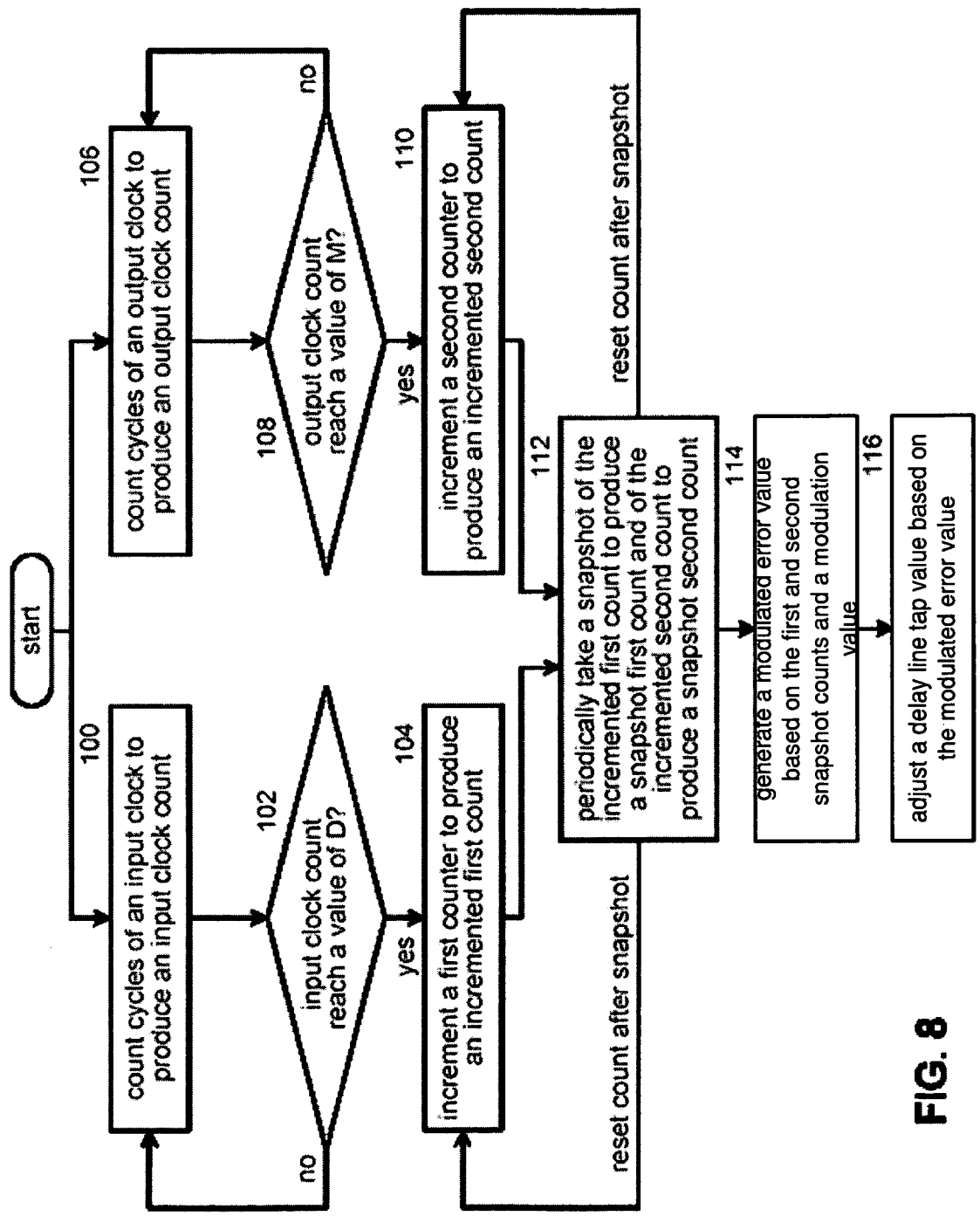
FIG. 8 is a logic diagram of a method for controlling a low jitter digital frequency synthesizer in accordance with the present invention.

FIG. 8 is a logic diagram of a method for controlling a low jitter digital frequency synthesizer. The process begins at Step 100 and 106. At Step 100, cycles of an input clock are counted to produce an input clock count. The process then proceeds to Step 102 where a determination is made as to whether the input clock count reaches a value of D. If not, the process remains in the loop of counting cycles until the input clock count reaches the value of D. When the clock count reaches the value of D, the process proceeds to Step 104 where a $1^{st}$ counter is incremented to produce an incremented $1^{st}$ count.

At Step 106, cycles of an output clock are counted to produce an output clock count. Once the output clock count reaches a value of M the process proceeds to Step 110 where a $2^{nd}$ counter is incremented to produce an incremented $2^{nd}$ count.

The process then proceeds to Step 112 where a snapshot of the incremented $1^{st}$ count is periodically taken to produce a snapshot $1^{st}$ count and a snapshot is periodically taken of the incremented $2^{nd}$ count to produce a snapshot $2^{nd}$ count. In addition, the incrementing of the $1^{st}$ counter and $2^{nd}$ counter are reset once the snapshots are taken. Note that the counting of output cycles at Steps 106 and 108 and the counting of input cycles at Steps 100 and 102 continue as the subsequent processing steps occur.

The process then proceeds to Step 114 where a modulated error value is generated based on the snapshot $1^{st}$ count, the snapshot $2^{nd}$ count and a modulation value. This may be done by adding one of the snapshot $1^{st}$ count or the snapshot $2^{nd}$ count with a previous modulation error value to determine an addition error value.

Referring back to the embodiments of FIGS. 5A and 5B, module 80 determines a first error value 49 as the difference between the addition error value (output by adder 78) and another one of the snapshot $1^{st}$ value and snapshot $2^{nd}$ value. For example, the snapshot $1^{st}$ count 46 may be added to the previous modulation error value to produce the addition error value. The snapshot $2^{nd}$ value 48 is subtracted from the addition error value to determine a current first error value 49. A modulation value 79 is added to the first error value 49 to produce the modulated error value 50.

Referring back to the embodiment of FIG. 5C, the module 80 can determine the modulated error value 50 as the difference between the addition error value (output by adder 78) and another one of the snapshot $1^{st}$ value and/or snapshot $2^{nd}$ value, plus the modulation value 79. For example, the snapshot $1^{st}$ count 46 may be added to the previous modulation error value to produce the addition error value. The snapshot $2^{nd}$ value 48 may then be subtracted from the addition error value, and a modulation value 79 can be added, to determine the modulated error value 50.

Referring again to FIG. 8, the process then proceeds to Step 116 where a delay line tap value is adjusted based on the modulated error value. This may be done by comparing the modulated error value with a previous modulated error value to determine whether sign of the modulated error value has changed with respect to the previous modulated error value. If the sign has changed, a determination is made as to the amount of the adjusting of the delay line tap as to be made based on the current modulated error value and parameters of the digital frequency synthesizer where such parameters include number of taps within the delay tap line, slew rate of the delay line, et cetera. In addition, the adjusting may be done by comparing the modulated error value with a previous modulation error value to determine whether the magnitude of the modulation error value has increased with respect to the previous modulation error value. If so, a determination is made as to the amount of the adjustment of the delay line tap as to be made based on the current modulation error value and the parameters of the digital frequency synthesizer. As such, the delay line is operating as a free-running oscillator which decouples it from the input clock thereby reducing jitter induced by the input clock to produce a low jitter output clock.

Figure 9:
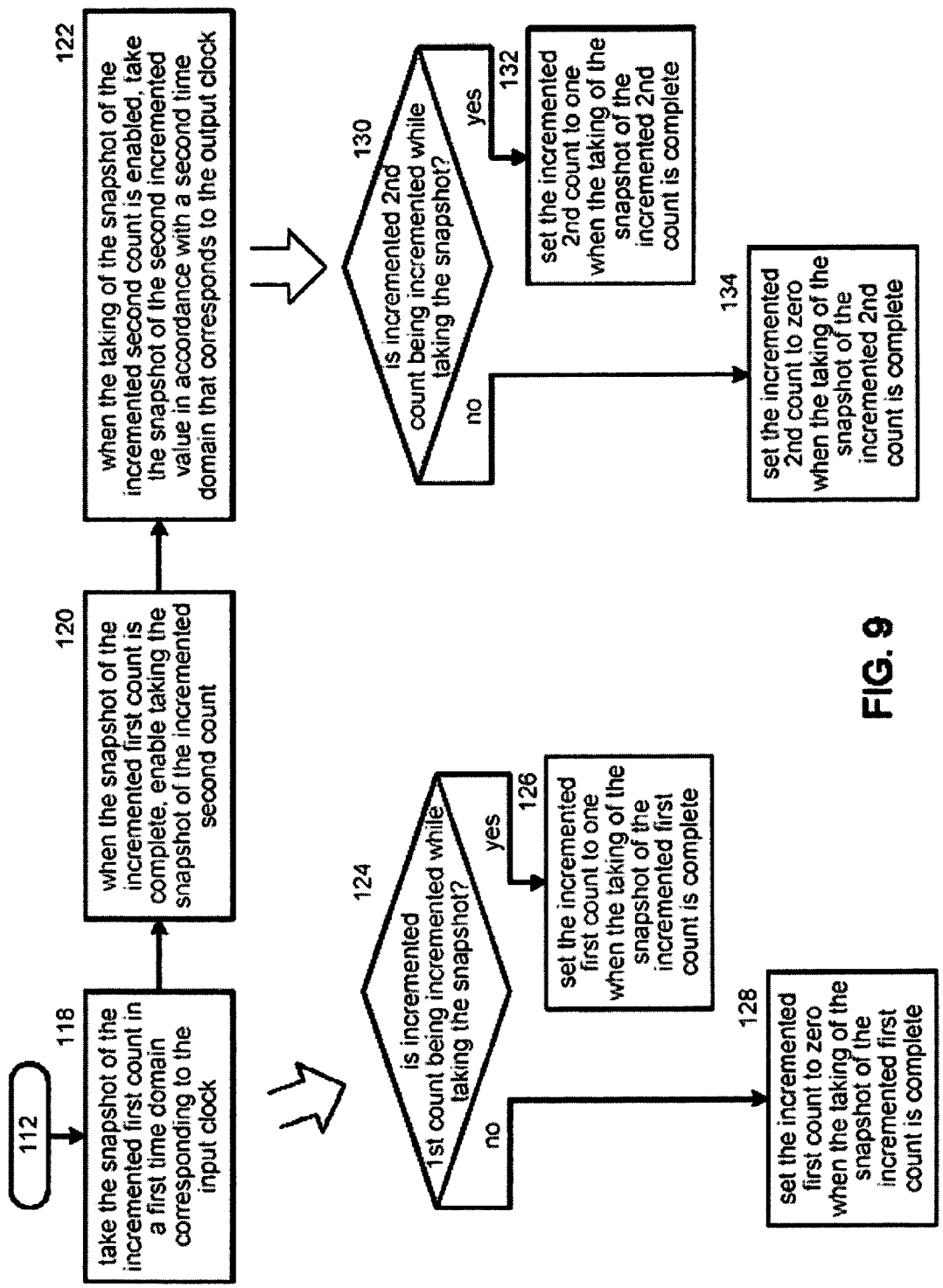
FIG. 9 is a logic diagram of a method further defining Step 112 of FIG. 8.

FIG. 9 is a method illustrating the periodic snapshots of the $1^{st}$ and $2^{nd}$ counts. The process begins at Step 118 where the snapshot of the incremented $1^{st}$ count is taken in a $1^{st}$ time domain that corresponds to the input clock. This is done as shown in Steps 124-126. At Step 124, a determination is made as to whether the incremented $1^{st}$ count is being incremented while the snapshot is being taken. If not, the process proceeds to Step 128 where the incremented $1^{st}$ count is set to zero once the snapshot is taken. If the incrementing is occurring while the snapshot is being taken, the process proceeds to Step 126. At Step 126, the incremented $1^{st}$ count is set to 1 once the snapshot has been completed.

Once the $1^{st}$ snapshot has been taken, the process proceeds to Step 120 where the taking of the snapshot of the incremented $2^{nd}$ count is enabled. The process then proceeds to Step 122 where the snapshot of the $2^{nd}$ incremented count value is taken in accordance with a $2^{nd}$ timed domain that corresponds to the output clock. This may be done as illustrated in Steps 130-134. At Step 130, a determination is made as to whether the incrementing of the $2^{nd}$ count is occurring during the taking of the snapshot of the incremented $2^{nd}$ count. If not, the process proceeds to Step 134 where the incremented $2^{nd}$ count is set to zero once the snapshot is complete. If the $2^{nd}$ count is being incremented while a snapshot is being taken, the process proceeds to Step 132 where the incremented $2^{nd}$ count is set to 1 once the snapshot is complete.

Figure 10:
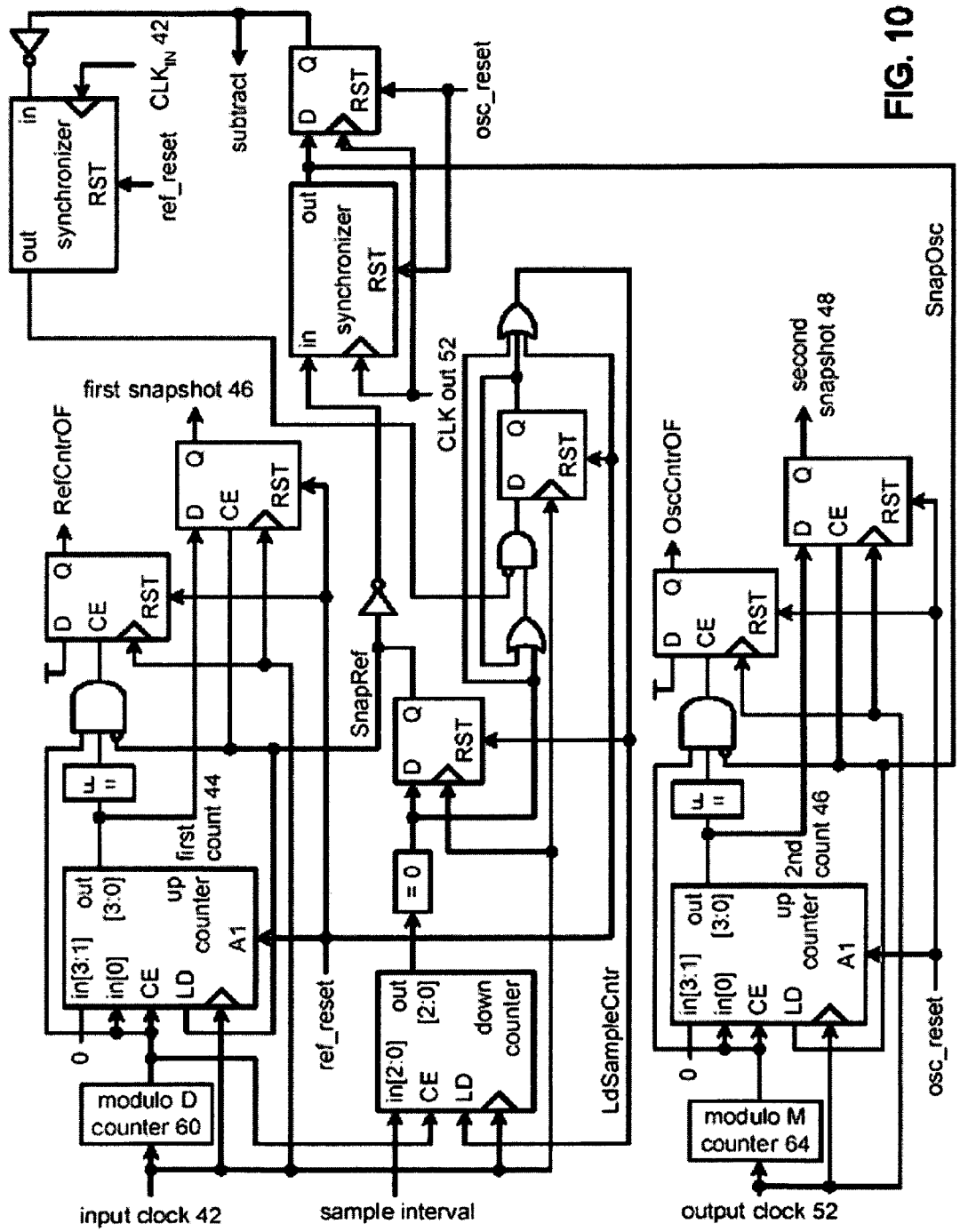
FIG. 10 is a schematic block diagram of the snapshot module and $1^{st}$ and $2^{nd}$ count modules of a low jitter digital frequency synthesizer in accordance with the present invention.

FIG. 10 is a detailed schematic block diagram of the snapshot module 36 and the $1^{st}$ and $2^{nd}$ count modules 32 and 34. The 1st count module 32 includes the modulo D counter 60 and the up-counter associated therewith. The $2^{nd}$ count module 34 includes the modulo M counter 64 and the up-counter associated therewith. The remaining components correspond to the snapshot module 36 to produce the $1^{st}$ snapshot 46 and $2^{nd}$ snapshot 48.

Figure 11A:
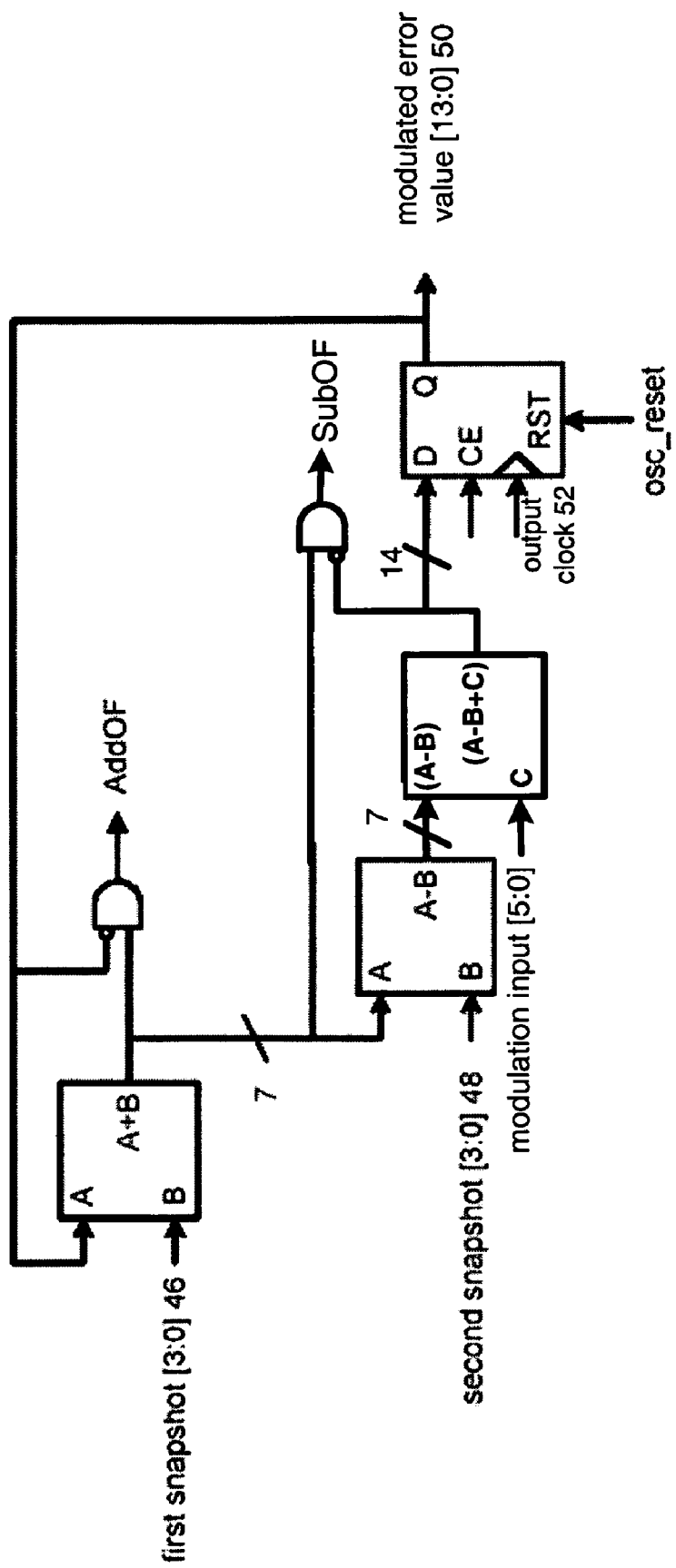
FIGS. 11A and 11B are schematic block diagrams of an error value generation module of a low jitter frequency synthesizer in accordance with the present invention.
Figure 11B:
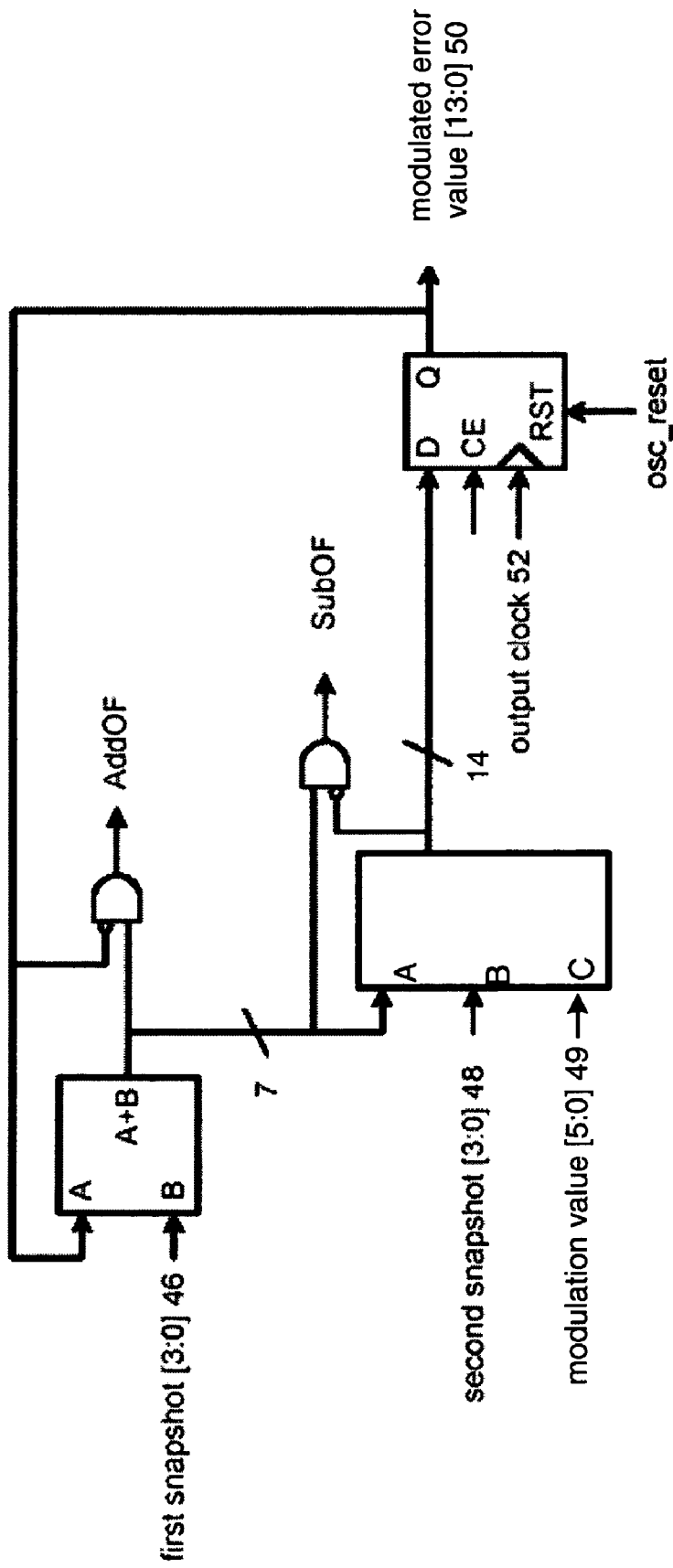

FIG. 11A is a schematic block diagram of an embodiment of the error value generation module 38 that includes an addition module, a subtraction module, a further addition module and a D flip-flop. The embodiment of FIG. 11A can be used to implement the error value generation module shown in FIGS. 5A and 5B. FIG. 11B is a schematic block diagram of an embodiment of the error value generation module 38 that includes an addition module, a subtraction/addition module and a D flip-flop. The embodiment of FIG. 11B can be used to implement the error value generation module shown in FIG. 5C. The error value generation module 38, as coupled in FIGS. 11A and 11B, produces the modulated error value 50.

Figure 12:
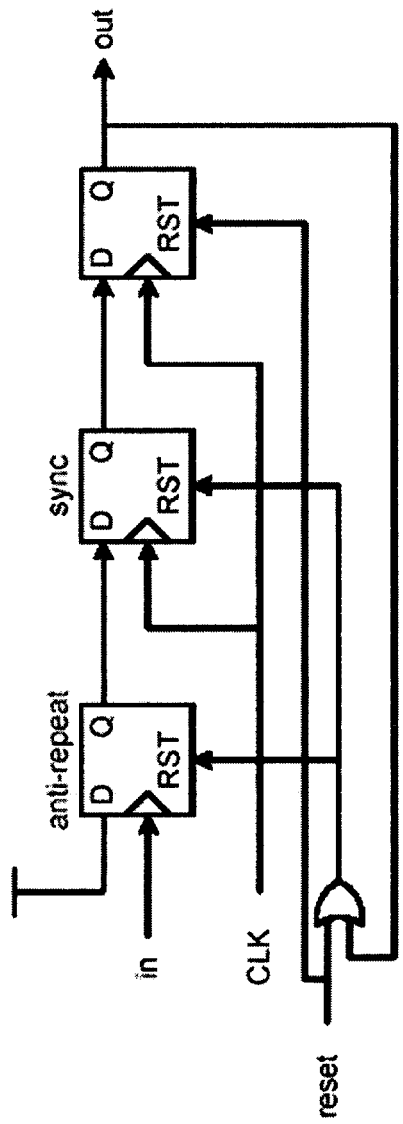
FIG. 12 is a schematic block diagram of a synchronizer module of the snapshot module as illustrated in FIG. 10.

FIG. 12 is a schematic block diagram of the synchronizer used in the snapshot module 36 of FIG. 10. The synchronizer in general aligns the sampling interval for taking the $1^{st}$ and $2^{nd}$ snapshots by transferring control to a different time domain without clock glitches.

Figure 13:
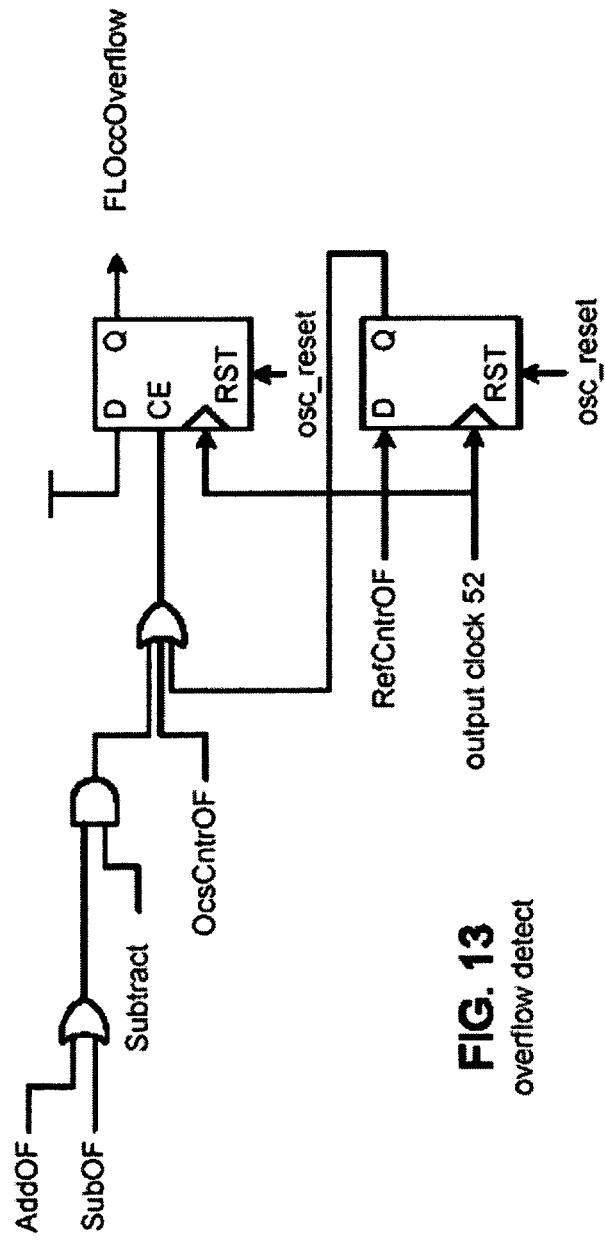
FIG. 13 is a schematic block diagram of an overflow detection module associated with the snapshot module of FIG. 10.

FIG. 13 illustrates an overflow detection circuit that may be included in the snapshot module 36 of FIG. 10 to detect whether an overflow condition has occurred with respect to the taking of the $1^{st}$ and $2^{nd}$ snapshots. If an overflow condition does occur, the current error calculation is inaccurate. The overflow condition is available as status, and the process is optionally reset.

Figure 14:
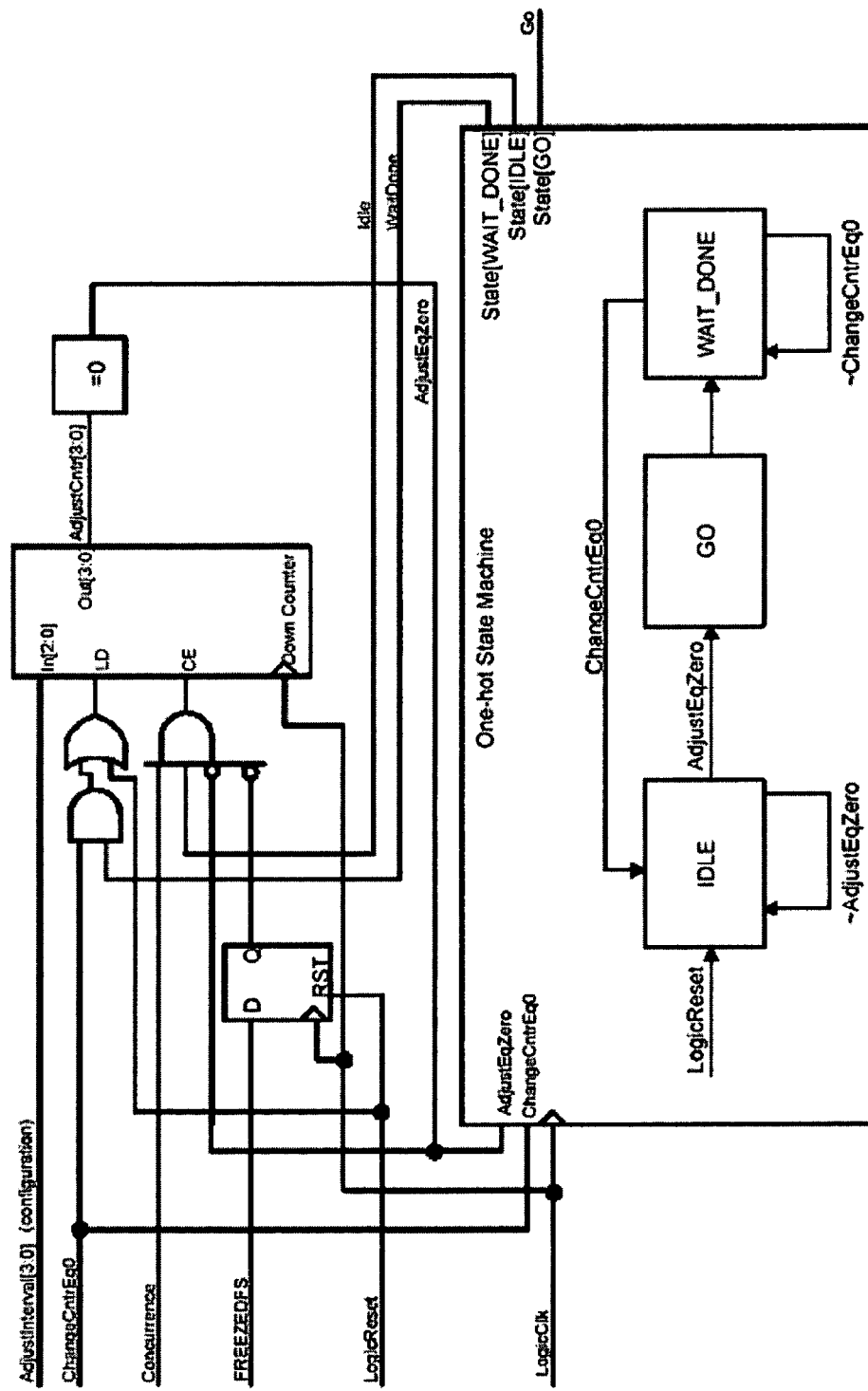
FIGS. 14 and 15 are schematic block diagrams of a control module of a low jitter digital frequency synthesizer in accordance with the present invention.
Figure 15:
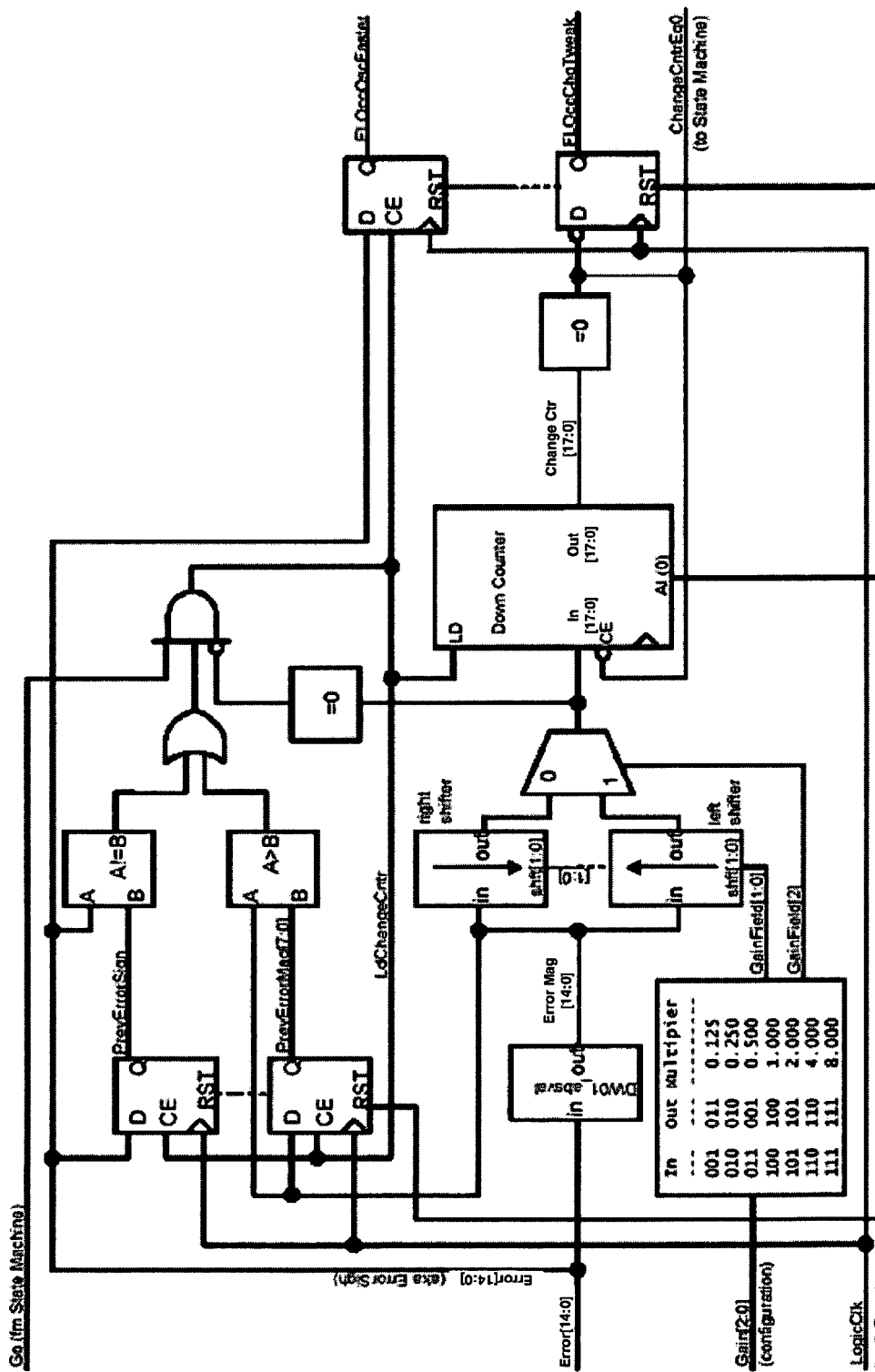

FIGS. 14 and 15 are schematic block diagrams of a first portion of the tap/trim/tweak of the digital delay line 40 as may be included in the control module 82 and/or the oscillation rate control module. The Tap/Trim/Tweak Adjustments performed by the control module 82 includes the control module 82 periodically reading the Error register and conditionally adjusting the oscillator frequency by adding or subtracting one or more Tweak units to/from the Tap/Trim/Tweak counter. Note that this logic is separate from the Frequency Error Accumulator logic, except that is uses the signed modulated Error value (and it adjusts the oscillator frequency, which will eventually be sensed by that logic).

The adjustment rate is controlled by the 4-bit Adjustinterval configuration field by loading it into a down counter that counts Concurrence pulses in the LogicClk domain. When the counter reaches zero, the Go signal initiates an adjustment cycle. If FREEZEDFS is active, count-down is disabled, so the Go signal is not generated until FREEZEDFS goes inactive.

The number of Tweak units that are added or subtracted is a function of the modulated Error magnitude and Gain, a 3-bit configuration field. Tweak delta equals ErrorMag times 2n, where n is an integer in the range −3 to +3, inclusive (corresponding to Gain configurations ranging from 001 to 111).

All adjustment cycles may not actually cause a change in Tap/Trim/Tweak. For a change to occur, both of the following must be true:

ErrorMag must be greater than it was at the previous change, or the modulated Error sign is different from the previous change.

The integer portion of ErrorMag times 2n is greater than zero.

The Tap/Trim/Tweak count can be changed only one unit per clock cycle. Whenever ChangeCntr is non-zero, D flip-flop FLOccChgTweak is set. One cycle earlier, the FLOccOscFaster flip-flop was set or cleared, depending on whether Error is negative or positive, respectively. When FLOccOscFaster is true, Tap/Trim/Tweak is incremented; otherwise, it is decremented.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a low jitter digital frequency synthesizer that utilizes a free-running oscillator. By decoupling the input clock from the output clock jitter induced by the input clock is avoided such that the output clock is substantially jitter-free other than the jitter inherently produced by the characteristics of the free-running oscillator. Also, by adding modulation to the error signal used to adjust the output clock, a spectrum of the output clock is spread. As one of average skill in the art will appreciate, other embodiments may be derived from the teaching of the present invention without deviating from the scope of the claims.

What is claimed is:

1. A method for controlling a low jitter digital frequency synthesizer, the method comprises:

counting cycles of an input clock to produce an input clock count;

counting cycles of an output clock to produce an output clock count;

when the input clock count reaches a value of D, incrementing a first counter to produce an incremented first count;

when the output clock count reaches a value of M, incrementing a second counter to produce an incremented second count;

periodically taking a snapshot of the incremented first count to produce a snapshot first count;

periodically taking a snapshot of the incremented second count to produce a snapshot second count;

generating a modulated error value based on the snapshot first count, the snapshot second count and a modulation value; and adjusting a delay line tap value based on the modulated error value.

2. The method of claim 1, further comprising:
periodically receiving the modulation value.

3. The method of claim 1, further comprising:
periodically generating the modulation value.

4. The method of claim 1, wherein the modulation value is a pseudo random number.

5. The method of claim 1, wherein an average of the modulation value over an extended period of time is substantially equal to zero.

6. The method of claim 1, wherein the generating the modulated error value comprises:

generating a first error value based on the snapshot first count and the snapshot second count; and adding the modulation value to the first error value to produce the modulated error value.

7. The method of claim 6, wherein the generating the first error value comprises:

adding one of the snapshot first count or the snapshot second count with a previous error value to produce an addition error value; and determining the first error value as a difference between the addition error value and another one of the snapshot first count or the snapshot second count.

8. A low jitter digital frequency synthesizer comprises:

a first counter module operably coupled to count intervals of M cycles of an input clock of the low jitter digital frequency synthesizer to produce a first count;

a second counter module operably coupled to count intervals of D cycles of an output clock of the low jitter digital frequency synthesizer to produce a second count, wherein an average rate of the output clock corresponds to M/D times a rate of the input clock;

a snapshot module operably coupled to periodically take a snapshot of the first count to produce a first snapshot and of the second count to produce a second snapshot;

an error value generation module operably coupled to generate a modulated error value based on the first snapshot, the second snapshot and a modulation value; and a tapped delay line module operably coupled to produce the output clock based on the modulated error value.

9. The low jitter digital frequency synthesizer of claim 8, further comprising:

a modulation module to periodically generate the modulation value.

10. The low jitter digital frequency synthesizer of claim 9, wherein the modulation value is a pseudo random value.

11. The low jitter digital frequency synthesizer of claim 10, wherein the modulation module comprises a pseudo random shift register that outputs the pseudo random modulation value.

12. The low jitter digital frequency synthesizer of claim 10, wherein the modulation module comprises a block RAM that outputs the pseudo random modulation value.

13. The low jitter digital frequency synthesizer of claim 8, wherein an average of the modulation value over an extended period of time is substantially equal to zero.

14. The low jitter digital frequency synthesizer of claim 8, wherein error value generation module further functions to:

generate a first error value based on the snapshot first count and the snapshot second count; and add the modulation value to the first error value to produce the modulated error value.

15. The low jitter digital frequency synthesizer of claim 14, wherein error value generation module further functions to:

add one of the snapshot first value or the snapshot second value with a previous error value to produce an addition error value; and determine the first error value as a difference between the addition error value and one of the snapshot first value or the snapshot second value.

16. A programmable logic device comprises:

a programmable logic fabric;

memory operably coupled to the programmable logic fabric;

an input/output section operably coupled to the programmable logic fabric and to the memory, wherein the input/output section includes a low jitter digital frequency synthesizer that includes:

a first counter module operably coupled to count intervals of M cycles of an input clock of the low jitter digital frequency synthesizer to produce a first count;

a second counter module operably coupled to count intervals of D cycles of an output clock of the low jitter digital frequency synthesizer to produce a second count, wherein an average rate of the output clock corresponds to M/D times a rate of the input clock;

a snapshot module operably coupled to periodically take a snapshot of the first count to produce a first snapshot and of the second count to produce a second snapshot;

an error value generation module operably coupled to generate a modulated error value based on the first snapshot, the second snapshot and a modulation value; and a tapped delay line module operably coupled to produce the output clock based on the modulated error value.

17. The programmable logic device of claim 16, further comprising:

a modulation module to periodically generate the modulation value.

18. The programmable logic device of claim 17, wherein the modulation value is a pseudo random value.

19. The programmable logic device of claim 16, wherein an average of the modulation value over an extended period of time is substantially equal to zero.

20. The programmable logic device of claim 16, wherein the error value generation module further functions to:
generate a first error value based on the snapshot first count and the snapshot second count; and
add the modulation value to the first error value to produce the modulated error value.

* * * * *